United States Patent
Byeon

(10) Patent No.: US 9,165,624 B2
(45) Date of Patent: Oct. 20, 2015

(54) SEMICONDUCTOR INTEGRATED CIRCUIT WITH SWITCH TO SELECT SINGLE OR MULTIPLE CHIPS

(71) Applicant: SK Hynix Inc., Icheon-si Gyeonggi-do (KR)

(72) Inventor: Sang Jin Byeon, Icheon-si (KR)

(73) Assignee: SK Hynix Inc., Gyeonggi-do (KR)

( * ) Notice: Subject to any disclaimer, the term of this patent is extended or adjusted under 35 U.S.C. 154(b) by 183 days.

(21) Appl. No.: 13/845,349

(22) Filed: Mar. 18, 2013

(65) Prior Publication Data

US 2014/0175668 A1 Jun. 26, 2014

(30) Foreign Application Priority Data

Dec. 24, 2012 (KR) .................. 10-2012-0152192

(51) Int. Cl.
*G11C 8/12* (2006.01)
*G11C 5/06* (2006.01)
*G11C 29/02* (2006.01)
*H01L 25/065* (2006.01)

(52) U.S. Cl.
CPC .. *G11C 8/12* (2013.01); *G11C 5/06* (2013.01); *G11C 29/022* (2013.01); *G11C 29/023* (2013.01); *G11C 29/028* (2013.01); *H01L 25/0657* (2013.01); *H01L 2924/0002* (2013.01)

(58) Field of Classification Search
CPC .............. H01L 21/76877; H01L 23/4012; H01L 21/8221; H01L 25/043; H01L 25/0657; H01L 2924/0002; G11C 5/06; G11C 5/02; G11C 5/025

USPC ............ 365/189.011, 230.01, 51, 63, 72, 365/230.03, 189.02, 189.17, 198
See application file for complete search history.

(56) References Cited

U.S. PATENT DOCUMENTS

| | | | |
|---|---|---|---|
| 8,471,362 B2 * | 6/2013 | Lee .............................. | 257/532 |
| 8,760,181 B2 * | 6/2014 | Byeon et al. ............. | 324/750.15 |
| 8,801,279 B2 * | 8/2014 | Kim et al. ..................... | 374/152 |
| 2009/0161401 A1 * | 6/2009 | Bilger et al. .................... | 365/51 |
| 2011/0085397 A1 * | 4/2011 | Sato et al. ..................... | 365/219 |
| 2011/0309475 A1 * | 12/2011 | Lee .............................. | 257/532 |
| 2012/0007624 A1 * | 1/2012 | Byeon et al. ............. | 324/750.15 |
| 2012/0163413 A1 * | 6/2012 | Kim et al. ..................... | 374/152 |
| 2012/0212990 A1 * | 8/2012 | Park et al. ....................... | 365/63 |
| 2013/0021866 A1 * | 1/2013 | Lee .......................... | 365/230.01 |

FOREIGN PATENT DOCUMENTS

| | | |
|---|---|---|
| KR | 1020100066849 A | 6/2010 |
| KR | 1020100135091 A | 12/2010 |

* cited by examiner

*Primary Examiner* — Richard Elms
*Assistant Examiner* — Jerome Leboeuf
(74) *Attorney, Agent, or Firm* — William Park & Associates Ltd.

(57) ABSTRACT

A semiconductor integrated circuit includes: a first interface block configured to transmit and receive signals within the same chip; a second interface block configured to transmit and receive signals to and from different semiconductor chips; and a switching block configured to select a signal path in which the signal transmission and reception of the first interface block is not performed through the second interface block, in response to a chip structure signal.

18 Claims, 3 Drawing Sheets

SEMICONDUCTOR INTEGRATED CIRCUIT WITH SWITCH TO SELECT SINGLE OR MULTIPLE CHIPS

CROSS-REFERENCES TO RELATED APPLICATION

The present application claims priority under 35 U.S.C. §119(a) to Korean application number 10-2012-0152192, filed on Dec. 24, 2012, in the Korean Intellectual Property Office, which is incorporated herein by reference in its entirety.

BACKGROUND

1. Technical Field

Various embodiments generally relate to a semiconductor integrated circuit.

2. Related Art

A semiconductor integrated circuit may have a single chip package structure or a multi-chip package structure including a plurality of semiconductor chips to improve the integration degree.

Examples of the multi-chip package may include a structure in which a plurality of semiconductor chips are stacked in a vertical direction so as to transmit/receive signals through a through-silicon via (TSV).

FIG. 1 is a plan view of a conventional semiconductor integrated circuit 1.

A plurality of semiconductor integrated circuits 1 illustrated in FIG. 1 may be stacked to implement a semiconductor integrated circuit having a multi-chip package structure.

Referring to FIG. 1, the conventional semiconductor integrated circuit 1 includes a plurality of memory banks BK0 to BK3, a plurality of global input/output lines GIO_L, GIO_R, WGIO, and RGIO, a unit input/output circuit block (IO-CELL) 10, an input/output multiplexer (MX) 20, a buffer (BUF) 30, a latch (LAT) 40, and interface logics 50 to 70.

The interface logics 50 to 70 are configured to transmit and receive write data, read data, and command/address signals CMD/ADD to and from semiconductor chips at different layers.

Each of the interface logics 50 to 70 includes a transmitter TX, a TSV, and a receiver TX.

The unit input/output circuit block 10 performs an operation of inputting and outputting data to and from a memory bank BK0 or BK1 through a connection operation with the input/output multiplexer 20.

The buffer 30 is configured to receive and buffer the command CMD and output the buffered signal to the latch 40.

The latch 40 is configured to adjust setup/hold timing of the command CMD and output the adjusted command.

The conventional semiconductor integrated circuit 1 includes the above-described interface logics 50 to 70 so as to be used as the multi-chip package structure.

Therefore, as loading is increased by the interface logics 50 to 70, signals passing through the interface logics 50 to 70 are inevitably delayed.

Due to the above-described signal delay, the conventional semiconductor integrated circuit 1 fabricated for a multi-chip package cannot be used as a single chip package structure.

When semiconductor integrated circuits used in the single chip package structure and the multi-chip package structure, respectively, are fabricated with different structures, more serious problems than the degradation of signal characteristic may occur. For example, cost increase and productivity reduction may occur.

SUMMARY

A semiconductor integrated circuit which may be used in a single chip package structure as a multi-chip package structure is described herein.

In an embodiment of the present invention, a semiconductor integrated circuit includes: a first interface block configured to transmit and receive signals within the same chip; a second interface block configured to transmit and receive signals to and from different semiconductor chips; and a switching block configured to select a signal path in which the signal transmission and reception of the first interface block is not performed through the second interface block, in response to a chip structure signal.

In an embodiment of the present invention, a semiconductor integrated circuit includes: one or more memory banks; a first interface block configured to transmit and receive signals to and from the memory bank; a second interface block configured to transmit and receive signals to and from different semiconductor chips; and a switching block configured to select a signal path in which the signal transmission/reception of the first interface block is performed without passing through the second interface block when the semiconductor integrated circuit has a single chip structure, and select a signal path in which the signal transmission/reception of the first interface block is performed through the second interface block when the semiconductor integrated circuit has a multi-chip structure.

BRIEF DESCRIPTION OF THE DRAWINGS

Features, aspects, and embodiments are described in conjunction with the attached drawings, in which.

DETAILED DESCRIPTION

Hereinafter, a semiconductor integrated circuit according to the present invention will be described below with reference to the accompanying drawings through various embodiments.

Figure 1:
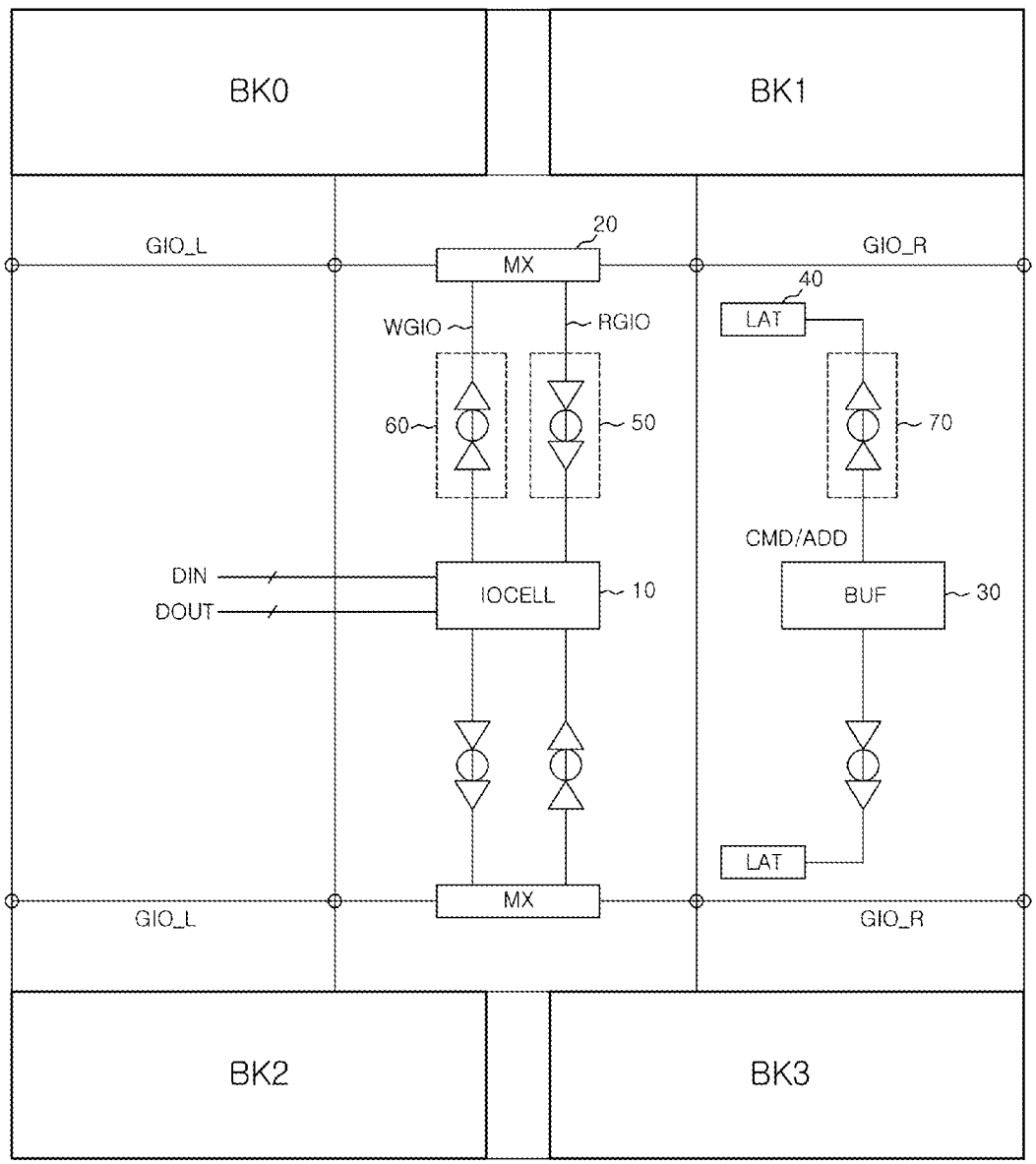
FIG. 1 is a plan view of a conventional semiconductor integrated circuit 1.
Figure 2:
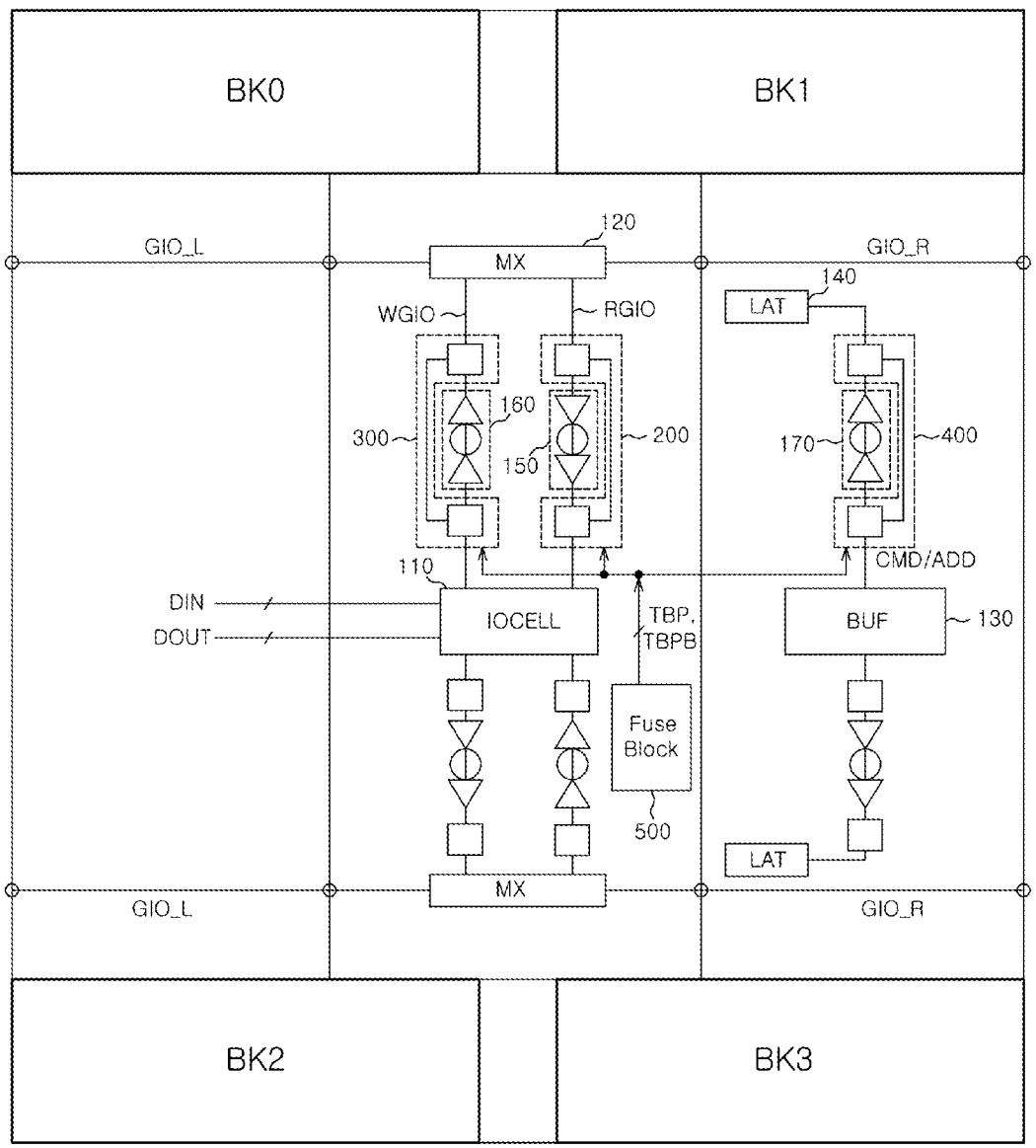
FIG. 2 is a plan view of a stacked semiconductor integrated circuit 100 according to an embodiment of the present invention.

FIG. 2 is a plan view of a stacked semiconductor integrated circuit 100 according to an embodiment of the present invention.

Referring to FIG. 2, the semiconductor integrated circuit 100 according to the embodiments of the present invention may include a plurality of memory banks BK0 to BK3, a plurality of global input/output lines GIO_L, GIO_R, WGIO, and RGIO, first interface blocks 110 to 140, second interface blocks 150 to 170, first to third switching blocks 200 to 400, and a fuse block 500.

The first interface blocks 110 to 140 may be configured to transmit and receive write data, read data, and command/address signals CMD/ADD within the same chip.

The first interface blocks 110 to 140 include a unit input/output circuit block (IOCELL) 110, an input/output multiplexer (MX) 120, a buffer (BUF) 130, and a latch (LAT) 140.

The second interface blocks 150 to 170 may be configured to transmit and receive write data, read data, and command/address signals CMD/ADD to and from semiconductor chips at different layers.

The first to third switching blocks 200 to 400 may be configured to select a signal path in which the signal transmission and reception of the first interface blocks 110 to 140 is not performed through the second interface blocks 150 to 170, that is, the signal transmission and reception bypasses the second interface blocks 150 to 170, in response to chip structure signals TBP and TBPB.

The first to third switching blocks 200 to 400 may be configured to select a signal path in which the signal transmission and reception of the first interface blocks 110 to 140 is not performed through the second interface blocks 150 to 170, when the chip structure signals TBP and TBPB are activated, that is, correspond to a level to define that the semiconductor integrated circuit has a single chip structure.

The first to third switching blocks 200 to 400 may be configured to select a signal path in which the signal transmission and reception of the first interface blocks 110 to 140 is performed through the second interface blocks 150 to 170, when the chip structure signals are TBP and TBPB are deactivated, that is, correspond to a level to define that the semiconductor integrated circuit has a multi-chip structure.

The fuse block 500 may be configured to cut or rupture an internal fuse depending on whether the semiconductor integrated circuit has a single chip structure or multi-chip structure and generate the chip structure signals TBP and TBPB suitable for the corresponding structure.

The fuse block 500 may generate the chip structure signals TBP and TBPB at an activation level (for example, TBP=H and TBPB=L) when the semiconductor integrated circuit has a single chip structure, and may generate the chip structure signals TBP and TBPB at a deactivation level (for example, TBP=L and TBPB=H) when the semiconductor integrated circuit has a multi-chip structure.

The fuse block 500 may include a laser fuse, an electronic fuse and the like.

Furthermore, the chip structure signals TBP and TBPB may be generated by a mode register set (MRS) signal or test mode signal.

Figure 3:
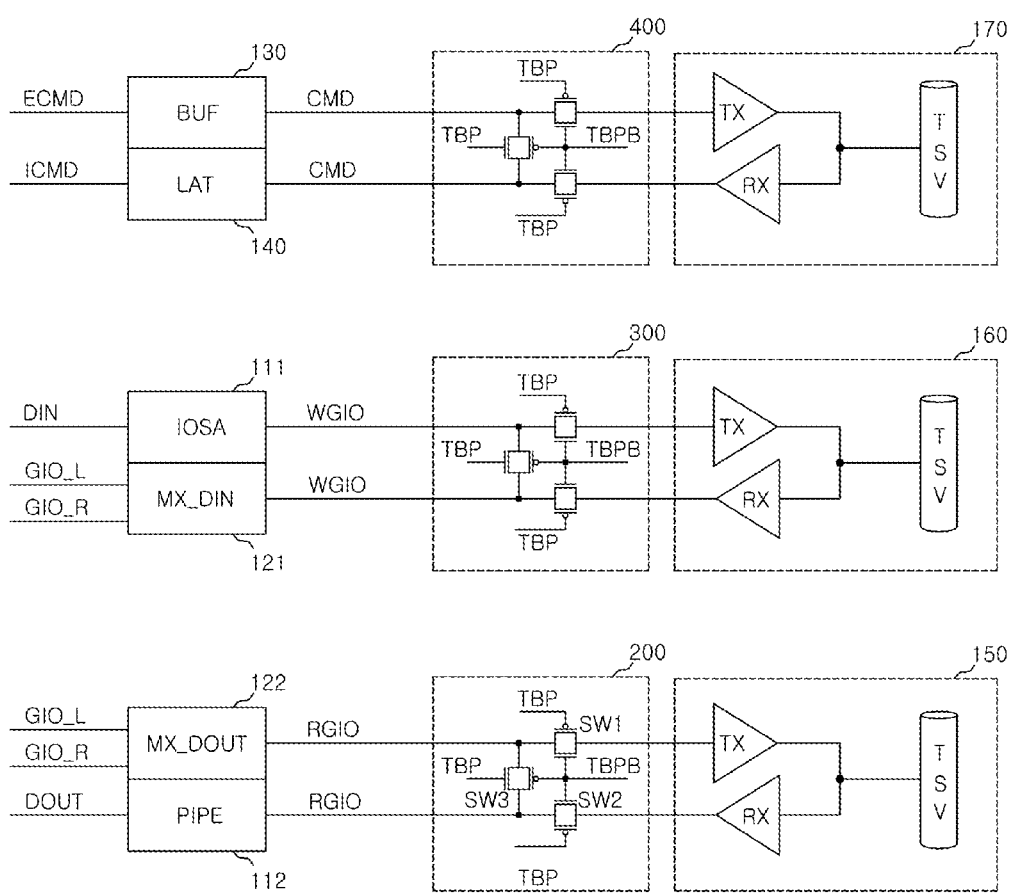
FIG. 3 is a diagram illustrating the connection relationship between first interface blocks 110 to 140 and second interface blocks 150 to 170 of FIG. 2.

FIG. 3 is a diagram illustrating the connection relationship between the first interface blocks 110 to 140 and the second interface blocks 150 to 170 of FIG. 2.

The unit input/output circuit block 110 of the first interface blocks 110 to 140 may include a sense amplifier (IOSA) 111 and a pipe latch (PIPE) 112.

The input/output multiplexer 120 may include an input multiplexer (MX_DIN) 121 and an output multiplexer (MX_DOUT) 122.

Each of the second interface blocks 150 to 170 may include a receiver TX, a TSV, and a receiver RX.

The output multiplexer 122 may be configured to transmit data loaded into the global input/output line GIO_L or GIO_R from the memory bank BK0 or BK1 to the read global input/output line RGIO.

The pipe latch 112 may be configured to sort and output the data loaded in the read global input/output line RGIO.

The sense amplifier 111 may be configured to sense and amplify data DIN inputted from outside and transmit the amplified data to the write global input/output line WGIO.

The input multiplexer 121 may be configured to transmit the data loaded in the write global input/output line WGIO through the global input/output line GIO_L or GIO_R such that the transmitted data is written into the memory bank BK0 or BK1.

The buffer 130 may be configured to buffer an external command ECMD and output the buffered command as a command CMD, and the latch 140 may be configured to adjust the setup/hold timing of the command CMD and output the adjusted command as an internal command ICMD.

At this time, the respective circuit block pairs, that is, the output multiplexer 122 and the pipe latch 112, the sense amplifier 111 and the input multiplexer 121, and the buffer 130 and the latch 140 are coupled to the second interface blocks 150 to 170, respectively, in order to transmit and receive signals to and from the semiconductor chips at different layers.

The first switching block 200 may include first to third switching elements SW1 to SW3.

Each of the first to third switching elements SW1 to SW3 may include a transmission gate.

The first switching element SW1 is coupled to an output signal line of the first interface block 120, that is, between the read global input/output line RGIO between the output multiplexer 122 and the transmitter TX of the second interface block 150, and enabled when the chip structure signals TBP and TBPB are deactivated.

The second switching element SW2 is coupled to an input signal line of the first interface block 110, that is, the read global input/output line RGIO between the pipe latch 112 and the receiver RX of the second interface block 150, and enabled when the chip structure signals TBP and TBPB are deactivated.

The third switching element SW3 is coupled between the output signal line of the first interface block 120 and the input signal line of the first interface block 110, that is, the read global input/output line RGIO coupled to the output multiplexer 122 and the read global input/output line RGIO coupled to the pipe latch 112, and enabled when the chip structure signals TBP and TBPB are activated.

The second and third switching blocks 300 and 400 include the same circuit components as the first switching block 200.

The second switching block 300 may be coupled between the second interface block 160 and the circuit block pair including the sense amplifier 111 and the input multiplexer 121 in the same manner as the first switching block 200.

The third switching block 400 may be coupled between the second interface block 170 and the circuit block pair including the buffer 130 and the latch 140 in the same manner as the first switching block 200.

The interface operation of the semiconductor integrated circuit according to the embodiments of the present invention will be described.

First, when the semiconductor integrated circuit 100 is applied to a single chip structure, the above-described fuse block 500 is used, or the test mode signal or the mode register set signal is used to output the chip structure signals TBP and TBPB at an activation level.

Since the chip structure signals TBP and TBPB are outputted at an activation level, the third switching element SW3 of the first to third switching blocks 200 to 400 of FIG. 3 is enabled, and the first and second switching elements SW1 and SW2 are disabled.

Since the third switching element SW3 is enabled, all signals of the first interface blocks 110 to 140, that is, data, commands, and addresses are not transmitted and received through the second interface blocks 150 to 170, but internally bypassed.

Since the signals of the first interface blocks 110 to 140, that is, the data, commands, and address are not transmitted and received through the second interface blocks 150 to 170, signal delay caused by the second interface blocks 150 to 170 does not occur, but the signals are normally transmitted and received.

Additionally, when the semiconductor integrated circuit 100 is applied to a multi-chip structure, that is, when the plurality of semiconductor integrated circuits 100 are stacked to form a stacked semiconductor integrated circuit, the above-described fuse block 500 is used, or the test mode signal or mode register set signal is used to output the chip structure signals TBP and TBPB at a deactivation level.

Since the chip structure signals TBP and TBPB are outputted at a deactivation level, the first and second switching elements SW1 and SW2 of the first to third switching blocks 200 to 400 of FIG. 3 are enabled, and the third switching element SW3 is disabled.

Since the first and second switching elements SW1 and SW2 are activated, all signals of the first interface blocks 110 to 140, that is, data, commands, and addresses are transmitted and received to the semiconductor chips at upper and/or lower layers through the second interface blocks 150 to 170.

That is, the data, commands, and addresses of the semiconductor chips forming the stacked semiconductor integrated circuit are normally transmitted and received.

According to the embodiments of the present invention, the semiconductor integrated circuit may be used for a single chip package structure as well as a multi-chip package structure.

While various embodiments have been described above, it will be understood to those skilled in the art that the embodiments described are by way of example only. Accordingly, the semiconductor integrated circuit described herein should not be limited based on the described embodiments. Rather, the semiconductor integrated circuit described herein should only be limited in light of the claims that follow when taken in conjunction with the above description and accompanying drawings.

What is claimed is:

1. A semiconductor integrated circuit comprising:
a first interface block, comprising a first sub-interface block and a second sub-interface block, configured to transmit and receive signals within a same semiconductor chip;
a second interface block configured to transmit and receive signals to and from different semiconductor chips; and
a switching block configured to feedback a signal output from the first sub-interface block to the second sub-interface block according to a chip structure signal which defines that the semiconductor integrated circuit has a single chip without passing through the second interface block.

2. The semiconductor integrated circuit according to claim 1, wherein the first interface block comprises one or more of components configured to transmit and receive write data, read data, and command/address signals within the same semiconductor chip.

3. The semiconductor integrated circuit according to claim 1, wherein the first interface block comprises:
a buffer configured to buffer an external command and output the buffered command as a command; and
a latch configured to adjust setup/hold timing of the command and output the adjusted command as an internal command.

4. The semiconductor integrated circuit according to claim 1, wherein the first interface block comprises:

an output multiplexer configured to receive data loaded in a global input/output line and transmit the received data to a read global input/output line; and
a pipe latch configured to sort and output the data loaded in the read global input/output line.

5. The semiconductor integrated circuit according to claim 1, wherein the first interface block comprises:
a sense amplifier configured to sense and amplify data inputted from outside and transmit the amplified data to a write global input/output line; and
an input multiplexer configured to transmit the data loaded in the write global input/output line to a global input/output line.

6. The semiconductor integrated circuit according to claim 1, wherein the second interface block comprises:
a transmitter having a first input terminal coupled to a transmitting configuration of the first interface block;
a through-silicon via coupled to an output terminal of the transmitter; and
a receiver having a second input terminal commonly coupled to the output terminal of the transmitter and the TSV and an output terminal coupled to a receiving configuration of the first interface block.

7. The semiconductor integrated circuit according to claim 1, wherein the switching block comprises:
a first switching element coupled to an output signal line of the first interface block and enabled according to the chip structure signal which defines that the semiconductor integrated circuit has multiple stacked chips;
a second switching element coupled to an input signal line of the first interface block and enabled according to the chip structure signal which defines that the semiconductor integrated circuit has multiple stacked chips; and
a third switching element coupled between the output signal line and the input signal line and enabled according to the chip structure signal which defines that the semiconductor integrated circuit only has the single chip.

8. The semiconductor integrated circuit according to claim 1, wherein the chip structure signal comprises a mode register set signal or test mode signal.

9. The semiconductor integrated circuit according to claim 1, further comprising a fuse block configured to generate the chip structure signal.

10. A semiconductor integrated circuit comprising:
one or more memory banks;
a first interface block, comprising a first sub-interface block and a second sub-interface block, configured to transmit and receive signals to and from the memory bank;
a second interface block configured to transmit and receive signals to and from different semiconductor chips; and
a switching block configured to feedback a signal output from first sub-interface block to the second sub-interface block without passing through the second interface block according to a chip structure signal which defines that the semiconductor integrated circuit only has a single chip, and transmit the signal output from the first interface block to the second interface block according to the chip structure signal which defines that the semiconductor integrated circuit has multiple stacked chips.

11. The semiconductor integrated circuit according to claim 10, wherein the first interface block comprises:
a buffer configured to buffer an external command and output the buffered command as a command; and
a latch configured to adjust setup/hold timing of the command and output the adjusted command as an internal command.

12. The semiconductor integrated circuit according to claim 10, wherein the first interface block comprises:
- an output multiplexer configured to receive data loaded in a global input/output line and transmit the received data to a read global input/output line; and
- a pipe latch configured to sort and output the data loaded in the read global input/output line.

13. The semiconductor integrated circuit according to claim 10, wherein the first interface block comprises:
- a sense amplifier configured to sense and amplify data inputted from outside and transmit the amplified data to a write global input/output line; and
- an input multiplexer configured to transmit the data loaded in the write global input/output line to a global input/output line.

14. The semiconductor integrated circuit according to claim 10, wherein the second interface block comprises:
- a transmitter having an input terminal coupled to a transmitting configuration of the first interface block;
- a through-silicon via coupled to an output terminal of the transmitter; and
- a receiver having an input terminal commonly coupled to the output terminal of the transmitter and the through-silicon via and an output terminal coupled to a receiving configuration of the first interface block.

15. The semiconductor integrated circuit according to claim 10, wherein the switching block comprises:
- a first switching element coupled to an output signal line of the first interface block and enabled according to the chip structure signal which defines that the semiconductor integrated circuit has multiple stacked chips;
- a second switching element coupled to an input signal line of the first interface block and enabled according to the chip structure signal which defines that the semiconductor integrated circuit has multiple stacked chips; and
- a third switching element coupled between the output signal line and the input signal line and enabled according to the chip structure signal which defines that the semiconductor integrated circuit only has the single chip.

16. The semiconductor integrated circuit according to claim 10, wherein a mode register set signal or test mode signal is used as the chip structure signal.

17. The semiconductor integrated circuit according to claim 10, further comprising a fuse block configured to generate the chip structure signal.

18. The semiconductor integrated circuit according to claim 17, wherein the fuse block includes a laser fuse or electronic fuse.

* * * * *